May 8, 1951 J. E. YOUNG 2,551,715
HIGH-FREQUENCY AMPLIFIER
Original Filed Oct. 16, 1945
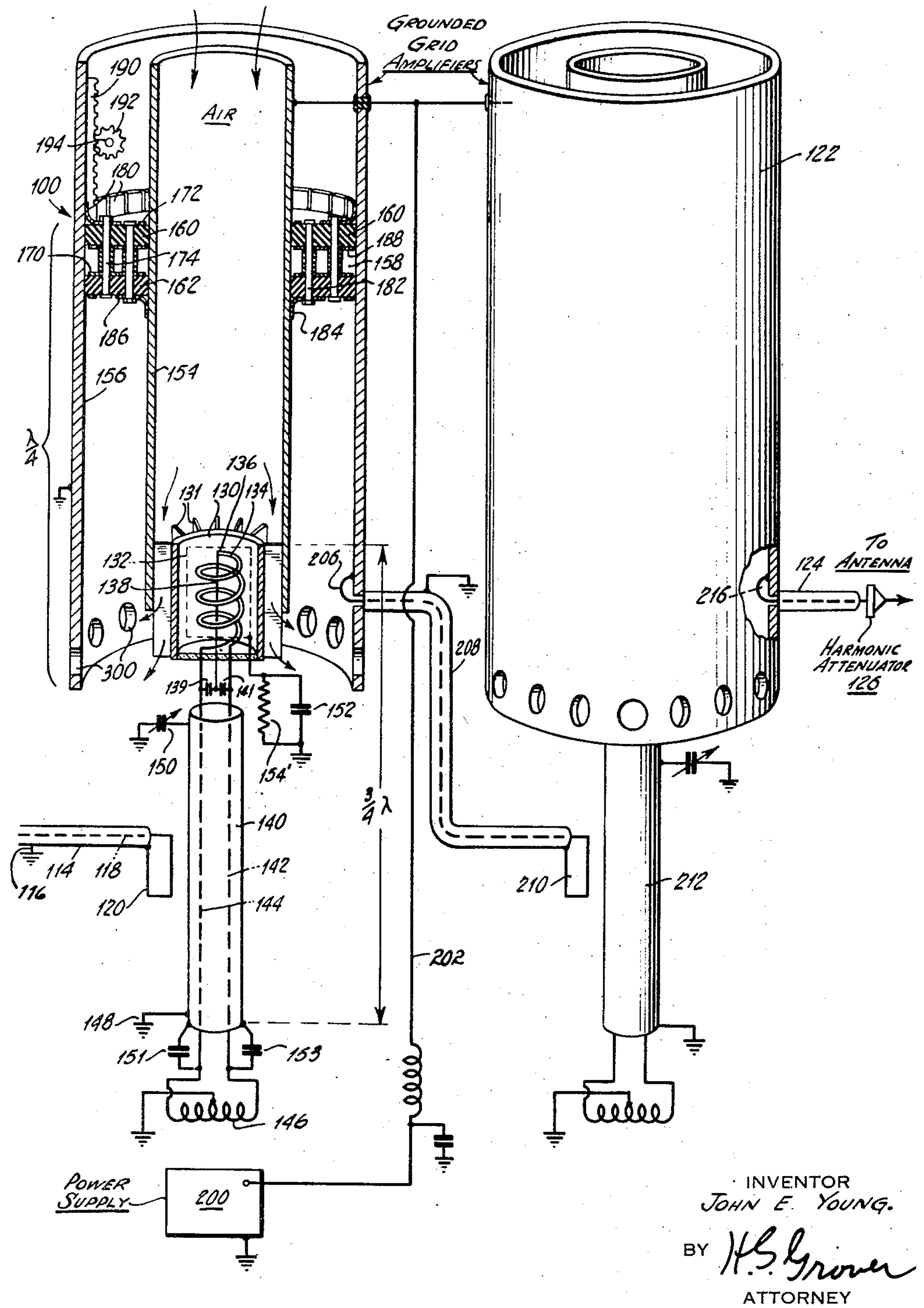
INVENTOR
JOHN E. YOUNG.
BY H. S. Grover
ATTORNEY Patented May 8, 1951 2,551,715

UNITED STATES PATENT OFFICE 2,551,715

HIGH-FREQUENCY AMPLIFIER

John E. Young, Merchantville, N. J., assignor to Radio Corporation of America, a corporation of Delaware Original application October 16, 1945, Serial No. 622,603. Divided and this application January 21, 1947, Serial No. 723,425

3 Claims. (Cl. 179—171)

This case, which is a division of my copending application Serial #622,603, filed October 16, 1945, now U. S. Patent 2,474,769 granted June 28, 1949, relates to high frequency apparatus and deals particularly with high power vacuum tube amplifying systems for short waves.

An object of my invention is to provide an improved high power amplifier system especially adapted for use at the higher frequencies. In carrying out this aspect of my invention, I make use of grounded grid power amplifier stages and circuits therefor which are especially free of, and the tendency to produce, parasitic oscillations. Also, I provide an improved cascaded arrangement of grounded grid amplifiers and circuits therefor which will develop substantial amounts of power at very short wave lengths.

A more detailed description of my present invention will now be given with the aid of the accompanying drawing wherein I have shown an improved power amplifier system, in accordance with my present invention, excited or driven by the frequency doubler, low power amplifier system of Figure 1 of my parent application. In the system illustrated herein, parasitics—a troublesome factor in high power operation—are minimized.

Referring to the drawing, wave energy is fed to the power amplifier 100 by way of a circuit involving a concentric transmission line 114, 118. As explained in my parent application, line 114, 118 is fed from a low power amplifier operating in the range of, for example, 78 to 108 megacycles. The output of this lower power amplifier may be a carrier lying in this band having a frequency modulation of ±75 kilocycles. The outer conductor 114 of the concentric line is grounded by connection 116 and the internal conductor 118 coupled by loop 120 to the cathode of power amplifier 100.

The output of amplifier 100 is fed to a succeeding power amplifier 122 similar in construction to amplifier 100. The output of the final power amplifier stage 122 is fed through a transmission line 124 and filter or harmonic attenuator 126 to a suitable broadcast antenna (not shown).

As shown, power amplifier 100 is provided with a grounded grid type of vacuum tube. This tube is provided with a closed-off cylindrical metal plate or anode 130 and grounded grid 132. The grounded grid substantially completely encloses and shields the bifilarly wound cathode 134 from anode 130.

The mid-point 136 of cathode 134 is connected by means of conductor or lead 138 and by-pass condensers 139, 141 to the cathode heating leads 142, 144 energized by the secondary of a 60 cycle power transformer 146.

The lower end of metal tube or cylinder 140 surrounding the heating leads is grounded at 148. By means of a variable condenser 150 connected near its upper end, cylinder 140 is tuned so that the effective electrical length from the top of the cathode to ground is an odd multiple of a quarter wave length, here shown to be ¾ of a wave length. In this way, the cathode vibrates at radio frequency potential with respect to ground, it being noted that the cathode, mid-point lead 138, metal tubular cylinder 140 and the heating conductors 142, 144 within it are effectively in parallel for radio frequency currents and voltages.

The grounding condenser 152 for the grid 132 is actually in the form of a metal ring or annulus, integral with the grid, brought through the glass seal of the vacuum tube, to the outside of the vacuum tube. This metal ring is capacitively ground at all points on its circumference by means of a similar metal ring separated by an annular insulator located between both metal rings. The annular capacitor is indicated diagrammatically at 152 and this capacity is shunted by a suitable leak resistor 154′. By-pass condensers 151 and 153 tie the heating leads to ground for radio frequency currents.

The metal anode 130 has mechanically and electrically fixed thereto radial metal cooling fins 131. Surrounding and connected to the fins is a metal cylinder 154 shown in cross section. This metal cylinder 154 forms the inner conductor of a concentric line tank circuit, the outer surrounding conductor of which is in the form of a grounded metallic cylinder 156, also shown in cross section. The upper outer end of inner conductor 154 is capacitively coupled to the inner surface of outer conductor 156 at point 158 so that the effective electrical length of the anode circuit is an odd multiple of a quarter wave length, here shown as one-quarter of a wave length, between the anode and the capacitive grounding point 158.

The adjustable capacitive grounding system 158 consists of a pair of annular rings of insulating material 160, 162. These rings may be made of a material known as "micalex." The upper and lower faces of the rings are coated with a metal such as silver or copper. The upper faces or electrodes 170, 172 are electrically connected together by bolts 174. The latter may also serve to hold the rings 160, 162 together, but insulatingly separated by insulating cylinders or washers surrounding connectors 174. By means of spring fingers 180 in electrical contact with the upper faces 172, sliding electrical contact is made with the inner surface of outer conductor 156.

Similarly, by means of connectors 182, the lower metallic faces of the disc or rings 160, 166 are connected in parallel and by means of metal connecting fingers 184 sliding electrical contact is made to the outer surface of inner conductor 154. It will be observed, therefore, that the capacities formed by the annular insulating rings 160, 162 and their metal faces 170, 172 and 186, 188 are in parallel, thereby increasing the effective capacity at the point 158. In this way the outer and inner conductors are connected together at point 158 by a connection of low impedance to radio frequency currents while separated electrically for direct current voltages.

Adjustment of the capacitive system 158 is effected by means of the rack 190 mechanically fastened to the capacitor assembly 158 and cooperating gear 192 which may be provided with an externally operable, rotatable drive shaft 194. Rotation of gear 192 drives rack 190 up or down, thereby moving capacitor assembly 158 along the longitudinal axis of the concentric line system 154, 156 thereby varying, as desired, the effective electrical length of the tank circuit 154, 156.

Plate voltage for power amplifier 100 is fed from a rectifier 200 and lead 202 to the inner conductor 154 of the plate tank circuit.

By means of coupling loop 206, preferably made variable, and a concentric transmission line 208, output energy is taken from amplifier 100 and fed to the following amplifier 122 by way of the loop 210 and cathode system 212 of power amplifier 122. Coupling loop 210 and cathode system 212 correspond in structure to loop 120 and cathode system 140 of amplifier 100. Also, since amplifier 122 is identical in all essential respects with amplifier 100, it has been shown only schematically and will not be described in detail.

Output from amplifier 122 is taken from an inductive loop 216 corresponding in structure to loop 206 and fed through transmission line 124 and harmonic attenuator or band pass filter 126 to an antenna.

Cooling air may be blown by a suitable blower (not shown) through the inner conductor 154 and through fins 131, escaping in part by way of openings 300 in the outer conductor 156.

In practice, I prefer to set up the apparatus of the drawing so that it is inverted with respect to the position illustrated. That is, the apparatus is supported and mounted so that the vacuum tubes, such as 130, and the leads thereto are uppermost. Also, in this preferred arrangement air is forced up from the bottom through the inner tubular conductors, such as 154, and the choke coil in power supply lead 202 is supported in the air stream at a point below the concentric line structures.

Having thus described my invention, what I claim is:

1. A high frequency amplifier comprising a vacuum tube having a directly heated cathode whose two sides are joined at one end removed from the source of heating supply, said tube having an anode surrounding said cathode and provided with cooling fins and a grid intermediate said cathode and anode, a pair of leads connecting said cathode to a source of heating supply, a metallic cylinder surrounding said leads, a connection capable of passing direct current from a point on said cylinder removed from said cathode to ground, an adjustable tuning capacitor coupling another point on said cylinder nearer said cathode to ground, bypass capacitors across said pair of leads at a point adjacent said cathodes, bypass capacitors from said leads to said cylinder near said ground point, a bypass capacitor coupling said grid to ground, an adjustable concentric line tank circuit coupled to said anode, said tank circuit having a hollow inner conductor coupled at one end to said anode and a surrounding outer conductor extending past said anode, means for supplying waves to be amplified to said cylinder, and means for deriving the amplified output from said tank circuit.

2. A high frequency amplifier comprising a vacuum tube having a bifilarly wound cathode provided with a midpoint, an anode surrounding said cathode, and a grid intermediate said cathode and anode, a concentric line tank circuit having a hollow inner conductor connected to said anode and an outer conductor extending past said anode, a tuning capacitor across said tank circuit at a location approximately one-quarter of a wavelength away from the open end of said outer conductor at the operating frequency, a bypass capacitor connecting said grid to ground, a pair of leads connecting said cathode to a source of heating supply, a metallic cylinder surrounding said heating leads, bypass capacitors between said leads and said midpoint of said cathode at a location near said cathode, an adjustable tuning capacitor coupling said cylinder to ground at a location near said cathode, a direct connection to ground from said cylinder at a location removed from said adjustable capacitor, bypass capacitors between said leads and said cylinder near said last location, said adjustable capacitor having such value that the effective electrical length from the end of said cathode farthest away from said heating leads to ground is an odd multiple of a quarter wavelength at the operating frequency, and means for feeding said amplifier with waves to be amplified at a location on said cylinder intermediate the adjustable tuning capacitor and said ground connection.

3. A high frequency amplifier as defined in claim 2, characterized in this that said vacuum tube is a forced air-cooled triode provided with cooling means forcing air through one end of the hollow inner conductor of said concentric line tank circuit at the location farthest removed from said anode.

JOHN E. YOUNG.

REFERENCES CITED

The following references are of record in the file of this patent:

UNITED STATES PATENTS

| Number | Name | Date |
|---|---|---|
| 2,157,855 | Koch | May 9, 1939 |
| 2,235,414 | White | Mar. 18, 1941 |
| 2,342,897 | Goldstine | Feb. 29, 1944 |
| 2,419,793 | Rosencrans | Apr. 29, 1947 |
| 2,419,800 | Tomlin | Apr. 29, 1947 |
| 2,463,724 | Starner | Mar. 8, 1949 |

FOREIGN PATENTS

| Number | Country | Date |
|---|---|---|
| 556,054 | Great Britain | Sept. 17, 1943 |